(12) United States Patent
Kawano et al.

(10) Patent No.: US 10,120,040 B2
(45) Date of Patent: Nov. 6, 2018

(54) MAGNETIC IMPEDANCE SENSOR

(71) Applicant: AICHI STEEL CORPORATION, Tokai-shi (JP)

(72) Inventors: Takeshi Kawano, Tokai (JP); Hitoshi Aoyama, Tokai (JP); Michiharu Yamamoto, Tokai (JP); Hideo Arakawa, Tokai (JP)

(73) Assignee: AICHI STEEL CORPORATION, Tokai-shi (JP)

( * ) Notice: Subject to any disclaimer, the term of this patent is extended or adjusted under 35 U.S.C. 154(b) by 0 days.

(21) Appl. No.: 15/076,748

(22) Filed: Mar. 22, 2016

(65) Prior Publication Data

US 2016/0282424 A1 Sep. 29, 2016

(30) Foreign Application Priority Data

Mar. 26, 2015 (JP) .................................. 2015-064124

(51) Int. Cl.
 *G01R 33/06* (2006.01)
 *G01R 15/20* (2006.01)
 (Continued)

(52) U.S. Cl.
 CPC ............ *G01R 33/063* (2013.01); *G01R 15/20* (2013.01); *G01R 15/207* (2013.01);
 (Continued)

(58) Field of Classification Search
 CPC ...... G01R 33/02; G01R 15/207; G01R 33/07; G01R 33/09; G01R 19/0092
 (Continued)

(56) References Cited

U.S. PATENT DOCUMENTS 3,376,427 A * 4/1968 James Mahoney William ............ H03K 17/82
307/415
6,028,427 A * 2/2000 Kawase ................. G01R 33/02
324/249

(Continued)

FOREIGN PATENT DOCUMENTS

JP 07-181239 A 7/1995
JP 2009-133789 A 6/2009
WO WO 2012-176451 A1 2/2015

OTHER PUBLICATIONS

Yudanov, N. A., et al. "Off-diagonal magnetoimpedance in amorphous wires and its application in miniature sensors of weak magnetic fields." Bulletin of the Russian Academy of Sciences: Physics 78.11 (2014): 1169-1173.*

(Continued)

*Primary Examiner* — Christopher McAndrew
(74) *Attorney, Agent, or Firm* — Oblon, McClelland, Maier & Neustadt, L.L.P.

(57) ABSTRACT

A magnetic impedance sensor comprises an amorphous wire 1 of a magneto-sensitive material as the magneto-impedance element, a pulse oscillator means 2 that alternately reverses and outputs a basic pulse current and a compensating pulse current with polarity opposite to the basic pulse current in predetermined periods, and a signal processing means 3 that converts an alternate current voltage generated in response to a magnetic field intensity around the amorphous wire by a magnetic impedance effect of the amorphous wire according to the pulse current into a magnetic signal voltage in response to the magnetic field intensity, and outputs the magnetic signal voltage. Since the amorphous wire 1 is repeatedly reversely magnetized in the u and v circumferential directions, due to compensating the negative pulse current, the magnetic sensor with excellent linear characteristics are obtained.

8 Claims, 12 Drawing Sheets

(51) Int. Cl.
 G01R 33/02 (2006.01)
 G01R 33/07 (2006.01)
 G01R 33/09 (2006.01)
 G01R 19/00 (2006.01)
(52) U.S. Cl.
 CPC .......... *G01R 19/0092* (2013.01); *G01R 33/02* (2013.01); *G01R 33/07* (2013.01); *G01R 33/09* (2013.01)
(58) Field of Classification Search
 USPC .......................................................... 324/244
 See application file for complete search history.

(56) References Cited

U.S. PATENT DOCUMENTS

| | | | | |
|---|---|---|---|---|
| 6,229,307 | B1* | 5/2001 | Umehara | G01R 33/02 324/244 |
| 6,404,182 | B1* | 6/2002 | Kawase | G01P 3/481 324/166 |
| 6,404,192 | B1* | 6/2002 | Chiesi | G01R 33/04 324/253 |
| 7,317,604 | B2* | 1/2008 | Kudo | G01R 15/205 361/54 |
| 8,680,854 | B2* | 3/2014 | Dyer | G01R 33/0052 324/249 |
| 2004/0257734 | A1 | 12/2004 | Kudo et al. | |
| 2006/0072272 | A1* | 4/2006 | Kudo | G01R 15/205 361/93.1 |
| 2013/0038323 | A1* | 2/2013 | Honkura | G01R 33/063 324/244 |

OTHER PUBLICATIONS

Yoon, Young-Doo, et al. "High-bandwidth sensorless algorithm for AC machines based on square-wave-type voltage injection." IEEE Transactions on Industry Applications 47.3 (2011): 1361-1370.*
Extended European Search Report dated Aug. 1, 2016 in Patent Application No. 16161836.8.
Office Action dated Dec. 20, 2017 in Japanese Application No. 2015-064124 with English Translation.

* cited by examiner

Fig. 2(a)  Fig. 2(b)  Fig. 2(c)
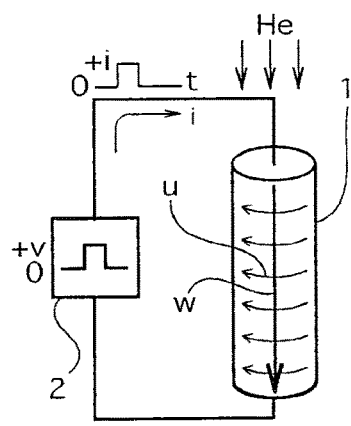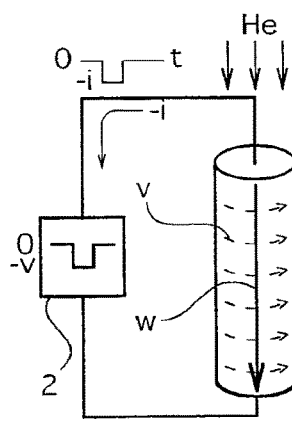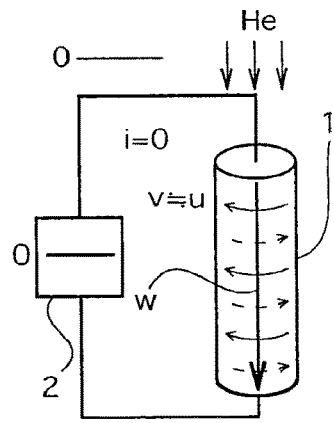
Fig. 3
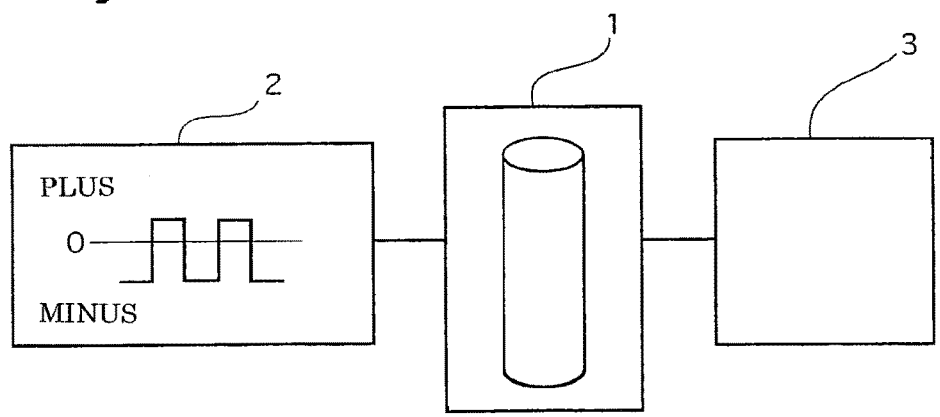

TIME WITHOUT SUPPLYING CURRENT

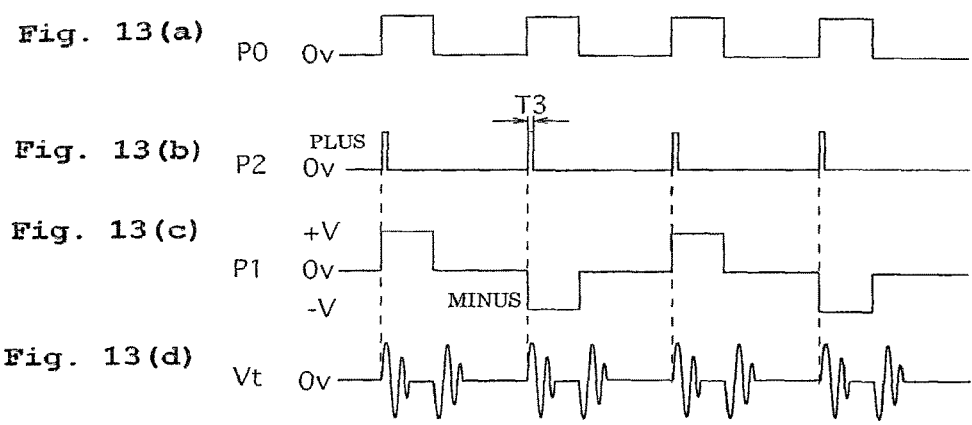

MAGNETIC IMPEDANCE SENSOR

TECHNICAL FIELD OF THE INVENTION

The present invention relates to a magnetic impedance sensor, as a high-sensitivity magnetic sensor, using an amorphous wire or a thin film, etc., as a magneto-sensitive material.

PRIOR ART

In a conventional magnetic impedance sensor, for example, as shown in FIG. 16 {FIG. 1 of Patent Literature 1 (WO 2005/019851)}, a pulse current supply is periodically applied with binary values at two logic levels of "0" and "1", that is, "0 volt" and a "positive or negative predetermined voltage" to an amorphous wire W by an output of a pulse generator P including a logic circuit.

That is, when the output of the pulse generator P is "0", no current flows in the amorphous wire W, and when the output is "1", a predetermined current flows in the amorphous wire W.

For example, as shown in FIG. 2(a), in the case of a circuit in which a positive current flows when the logic level is "1", a magnetizing force is generated according to the right-handed screw rule and magnetization in the circumferential direction of the amorphous wire 1 is constrained in the u direction, and in the case of a circuit in which a negative current flows when the logic level is "1", magnetization in the circumferential direction of the amorphous wire is constrained in the v direction as shown in FIG. 2(b).

On the other hand, when the logic level is "0", the enforced force to magnetize in the circumferential direction is lost and the magnetization is released, so that the magnetizations u and v in the circumferential directions are generally considered to be almost equivalent as shown in FIG. 2(c).

Another conventional magnetic impedance sensor comprises a magneto-impedance element which comprises a magneto-sensitive wire having a vortex-spin structure {Patent Literature 2 (WO 2009/119081)}.

SUMMARY OF THE INVENTION

Further by the next pulse, the magnetization is enforced again in the u or v direction and released again, and therefore, when the logic level of the output from the pulse generator P is "1", the magnetization is enforced in either the u or v circumferential direction, and when the next logic level is "0", the enforced force to magnetize is lost and the magnetization is released, and the amorphous wire has a tendency to return to the original zero-magnetized state.

However, in the state with a zero enforced force where the logic level is "0", although the magnetization may reverse and shift to return to the state of the logic level of "1", the magnetization does not shift across the zero-magnetized state without reversing, and there is no enforced force to magnetize of the amorphous wire to return to the original state. Therefore, in some cases, due to hysteresis or the like inside the amorphous wire, a portion of the amorphous wire may not partially completely return to the original zero-magnetized state, and the state where the amorphous wire is magnetized in the enforced direction may slightly remain. In this case, when a next pulse current is applied, the magnetization in the circumferential direction inside the amorphous wire does not start from the zero state, and if the above amorphous wire operates as a magnetic sensor, there is a problem that the amorphous wire has a possibility of an occurrence of non-linear characteristics may occur. That is, to prevent non-linear characteristics from being actualized, it is necessary for the magnetization to start from the zero-magnetized state in the circumferential direction. It is possible that the extent of the non-linear characteristics is improved to some degree by selecting an appropriate wire to be used (for example, refer to Patent Literature 2), however, a development of a new technology, that improves non-linear characteristics regardless of the wire to be used, has been strongly demanded.

The inventors of the present invention focused on a technical idea of the present invention in which by alternately supplying a basic pulse current for generating an alternate current voltage in response to a magnetic field intensity and a compensating pulse current with polarity opposite to the basic pulse current to a magneto-impedance element such as an amorphous wire, a magnetization in a circumferential direction was alternately reversed between a positive and negative across a released state where the magnetization in the circumferential direction is zero in such a manner that, for example, the magnetized state in the circumferential direction is reversed from "u" to "v," from "v" to "u" . . . , the magnetized state in the circumferential direction corresponding to the logic level of "0" in the conventional technology is shifted by the compensating pulse current to a magnetized state in the opposite polarity direction always after passing or going through or passing over (overgo) a zero-magnetized state, and accordingly, the magnetized state in the circumferential direction corresponding to the logic level of "0" was avoided from becoming a zero-magnetized state in a variation range of the magnetized state. Then, as a result of further repeated research and development, the inventors arrived to the present invention.

It is a general object of the present invention to provide a magnetic sensor with excellent linear characteristics without actualizing the non-linear characteristics.

It is a more specific object of the present invention to provide a magnetic impedance sensor on a first aspect of the present invention in which an alternate current voltage is generated in response to an external magnetic field intensity around a magneto-impedance element by applying an electrical pulse current to the magneto-impedance element, and the external magnetic field intensity around the magneto-impedance element is measured, and wherein the electrical pulse current comprises a basic pulse current for generating the alternate current voltage in response to the external magnetic field around the magnetic impedance element and a compensating pulse current for compensating the linear characteristic on opposite polarity to the basic pulse current and the basic pulse current and the compensating pulse current are alternately applied to the magneto-impedance element.

It is another object of the present invention to provide a magnetic impedance sensor on a second aspect of the present invention according to the first aspect of the present invention, in which an absolute value of the compensating pulse current is predetermined within a region of a certain rate being smaller than the absolute value of the basic pulse current.

It is a still another object of the present invention to provide a magnetic impedance sensor on a third aspect of the present invention according to the first aspect of the present invention, in which a period of time without supplying the current is interposed between a time for supplying the basic pulse current of applying to the magneto-impedance element and a time for supplying the compensating pulse current thereof.

It is a still another object of the present invention to provide a magnetic impedance sensor on a fourth aspect of the present invention according to the second aspect of the present invention, in which a period of time without supplying the current is interposed between a time for supplying the basic pulse current of applying to the magneto-impedance element and a time for supplying the compensating pulse current thereof.

It is a further object of the present invention to provide a magnetic impedance sensor on a fifth aspect of the present invention according to the first aspect of the present invention, it is constructed that a magnetic signal voltage is output by detecting the magnetic signal based on the alternate current voltage generated on both ends of the magneto-impedance element.

It is a further object of the present invention to provide a magnetic impedance sensor on a sixth aspect of the present invention according to the second aspect of the present invention, it is constructed that a magnetic signal voltage is output by detecting the magnetic signal based on the alternate current voltage generated on both ends of the magneto-impedance element.

It is a further object of the present invention to provide a magnetic impedance sensor on a seventh aspect of the present invention according to the third aspect of the present invention, it is constructed that a magnetic signal voltage is output by detecting the magnetic signal based on the alternate current voltage generated on both ends of the magneto-impedance element.

It is a further object of the present invention to provide a magnetic impedance sensor on an aspect of the present invention according to the fourth aspect of the present invention, it is constructed that a magnetic signal voltage is output by detecting the magnetic signal based on the alternate current voltage generated on both ends of the magneto-impedance element.

It is a still further object of the present invention to provide a magnetic impedance sensor on a ninth aspect of the present invention according to the first aspect of the present invention, it is constructed that a magnetic signal voltage is output by detecting the magnetic signal based on the alternate current voltage generated on both ends of a detecting coil wound around the magneto-impedance element.

It is a still further object of the present invention to provide a magnetic impedance sensor on a tenth aspect of the present invention according to the second aspect of the present invention, it is constructed that a magnetic signal voltage is output by detecting the magnetic signal based on the alternate current voltage generated on both ends of a detecting coil wound around the magneto-impedance element.

It is a still further object of the present invention to provide a magnetic impedance sensor on an eleventh aspect of the present invention according to the third aspect of the present invention, it is constructed that a magnetic signal voltage is output by detecting the magnetic signal based on the alternate current voltage generated on both ends of a detecting coil wound around the magneto-impedance element.

It is a still further object of the present invention to provide a magnetic impedance sensor on a twelfth aspect of the present invention according to the fourth aspect of the present invention, it is constructed that a magnetic signal voltage is output by detecting the magnetic signal based on the alternate current voltage generated on both ends of a detecting coil wound around the magneto-impedance element.

In the magnetic impedance sensor of the first aspect according to the present invention, having the above described construction, the alternate current voltage is generated in response to the external magnetic field intensity around the magneto-impedance element by applying the electrical pulse current to the magneto-impedance element, such as an amorphous wire and a thin film, and the external magnetic field intensity around the magneto-impedance element is measured, is constructed to pass through or pass over a zero-magnetized state by alternately supplying a basic pulse current for generating the alternate current voltage and the compensating pulse current, so that by alternately reversing a positive magnetized state and a negative magnetized state in a variation range of the magnetized state, the magnetized state therein corresponding to the logic level of "0" in the conventional technology where the magnetizing force becomes zero, is avoided, and accordingly, a magnetic sensor with excellent linear characteristics can be realized without actualizing non-linear characteristics thereof.

In the magnetic impedance sensor of the second aspect according to the present invention, having the above described construction of the first aspect, an absolute value of the compensating pulse current is predetermined within a region of a certain rate being smaller than the absolute value of the basic pulse current, to improve the linear characteristics, the compensating pulse current may not need to be supplied at the same magnitude as that of the basic pulse current and accordingly an excellent linear characteristics and energy-saving can be realized on the magnetic impedance sensor.

In the magnetic impedance sensor of the third aspect according to the present invention, having the above described construction of the first aspect, a period of time without supplying the current is interposed between a time for supplying the basic pulse current of applying to said magneto-impedance element and a time for supplying the compensating pulse current thereof, realizes an energy-saving sensor by reducing an average current to be supplied to the magneto-impedance element.

In the magnetic impedance sensor of the fourth aspect according to the present invention, having the above described construction of the second aspect, a period of time without supplying the current is interposed between a time for supplying the basic pulse current of applying to said magneto-impedance element and a time for supplying the compensating pulse current thereof, realizes an energy-saving sensor by reducing an average current to be supplied to the magneto-impedance element.

Further, by utilizing the techniques of the first aspect according to the present inventions, in the magnetic sensor of the fifth aspect of the present invention that measures a magnetic field based on an alternate current voltage generated on both ends of the magneto-impedance element and a magnetic sensor of the ninth aspect of the present invention that measures a magnetic field based on the alternate current voltage generated on both ends of a detecting coil wound around the magneto-impedance element can be constructed, and accordingly, the magnetic sensor with excellent linear characteristics can be realized.

By utilizing the techniques of the second aspect according to the present inventions, in the magnetic sensor of the sixth aspect of the present invention that measures a magnetic field based on an alternate current voltage generated on both ends of the magneto-impedance element and a magnetic sensor of the tenth aspect of the present invention that measures a magnetic field based on the alternate current voltage generated on both ends of a detecting coil wound around the magneto-impedance element can be constructed, and accordingly, the magnetic sensor with excellent linear characteristics can be realized.

By utilizing the techniques of the third aspect according to the present inventions, in the magnetic sensor of the seventh aspect of the present invention that measures a magnetic field based on an alternate current voltage generated on both ends of the magneto-impedance element and a magnetic sensor of the eleventh aspect of the present invention that measures a magnetic field based on the alternate current voltage generated on both ends of a detecting coil wound around the magneto-impedance element can be constructed, and accordingly, the magnetic sensor with excellent linear characteristics can be realized.

By utilizing the techniques of the fourth aspect according to the present inventions, in the magnetic sensor of the eighth aspect of the present invention that measures a magnetic field based on an alternate current voltage generated on both ends of the magneto-impedance element and a magnetic sensor of the twelfth aspect of the present invention that measures a magnetic field based on the alternate current voltage generated on both ends of a detecting coil wound around the magneto-impedance element can be constructed, and accordingly, the magnetic sensor with excellent linear characteristics can be realized.

BRIEF DESCRIPTION OF THE DRAWINGS

FIG. 2(a), FIG. 2(b) and FIG. 2(c) are explanatory views for describing states of magnetization in the circumferential directions inside an amorphous wire as a magneto-sensitive material when a positive or negative pulse current is applied thereto and when no current is applied thereto;

FIG. 3 is a block diagram showing an essential portion of a magnetic impedance sensor according to a first embodiment of the present invention, and a diagram showing a waveform of a pulse current to be supplied to the amorphous wire in the first embodiment;

FIG. 13(a), FIG. 13(b), FIG. 13(c) and FIG. 13(d) are diagrams showing waveforms of two pulse outputs and a detection output of a detecting coil in the second example;

DESCRIPTION OF THE PREFERRED EMBODIMENTS

Hereinafter, a best mode of the present invention will be described based on embodiments and examples by using drawings.

First Embodiment

A magnetic impedance sensor according to a first embodiment includes, as shown in FIG. 3, an amorphous wire 1 of a magneto-sensitive material as the magneto-impedance element, a pulse oscillator means 2 that alternately reverses and outputs a basic pulse current and a compensating pulse current with polarity opposite to the basic pulse current in predetermined periods, and a signal processing means 3 that converts an alternate current voltage generated in response to a magnetic field intensity around the amorphous wire by a magnetic impedance effect of the amorphous wire according to the pulse current into a magnetic signal voltage in response to the magnetic field intensity, and outputs the magnetic signal voltage.

Since the amorphous wire 1 as the magneto-sensitive element in the magnetic impedance sensor has high sensitivity, and when it has specifications with especially high sensitivity, the amorphous wire can detect a magnetic field intensity at a level of several nT (nT: $1/10^9$ of tesla) or less, as a result expectations have grown for use as a measurement of geomagnetic microscopic fluctuation caused by, for example, volcanism.

Figure 1:
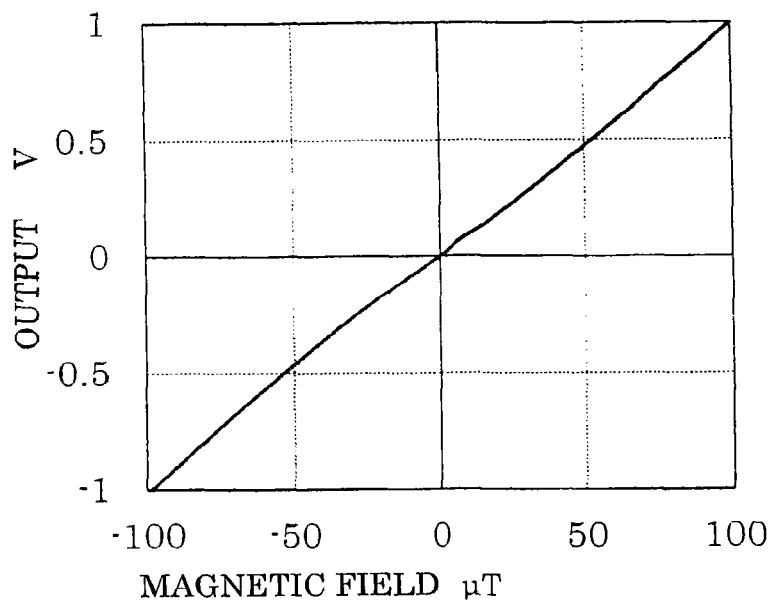
FIG. 1 is a diagram showing non-linearity in the relationship of a sensor output to a magnetic field intensity in a conventional magnetic impedance sensor.

However, the relationship of the output of the amorphous wire 1 as the magneto-sensitive element to a magnetic field intensity may become non-linear as shown in FIG. 1 depending on its individual characteristics when the amorphous wire is assembled as a magnetic sensor, and an error may be contained in a measured value, and therefore, for improvement in accuracy of the sensor, it needs to have excellent linearity.

In use for observation of geomagnetic fluctuation, etc., long-time continuous measurement with a limited power source capacity of a battery, etc., is needed, and therefore, improvement in energy-savings of the magnetic sensor has also been highly expected, and it has become necessary to satisfy these expectations.

Generally, the magnetic impedance sensor actualizes the magnetic impedance effect by generating magnetization in the u or v circumferential direction inside the amorphous wire 1 according to the Ampere's right-handed screw rule by supplying the pulse current i to the amorphous wire 1 as shown in FIG. 2(*a*) and FIG. 2(*b*), and accordingly, the alternate current voltage in response to the magnitude of the magnetization w inside the amorphous wire 1 energized by the external magnetic field He is generated on both ends of the amorphous wire 1, and the alternate current voltage is signal-processed by the signal processing means and output as a magnetic signal voltage.

In the above-described magnetic impedance sensor according to the first embodiment having the construction as shown in FIG. 3, the amorphous wire 1 is connected to the pulse oscillator means 2 that alternately reverses and outputs the basic pulse current and the compensating pulse current with polarity opposite to the basic pulse current in predetermined periods, and the amorphous wire 1 is supplied with the positive basic pulse current and the negative compensating pulse current (amplitudes of the positive and negative pulse currents are not limited to be positive/negative symmetrical to each other), so that the amorphous wire 1 is alternately supplied with positive and negative currents, and is repeatedly reversely magnetized in the u and v circumferential directions, and accordingly, an alternate current voltage generated by the magnetic impedance effect in the amorphous wire 1 by the pulse current is converted into a voltage in response to the magnetic signal by the signal processing means 3, and output.

As described above, in the magnetic impedance sensor according to the first embodiment, by repeatedly reversely magnetizing the amorphous wire 1 in the u and v circumferential directions, a zero state is passed through or passed over when performing magnetization in the circumferential direction by the basic pulse current so that, by alternately reversing the positive magnetized state and the negative magnetized state in the variation range of the magnetized state, the magnetized state therein corresponding to the logic level of "0" in the conventional technology where the magnetizing force becomes zero, is avoided to compensate the linear characteristics, and thus operations and effects of realizing the magnetic sensor with excellent linear characteristics are obtained.

The magnetic impedance sensor according to the first embodiment using an amorphous wire as the magneto-sensitive material is described above, however, the same effect as that of the first embodiment can also be obtained on a modification according to the first embodiment in which a thin film is used as the magneto or magnetic impedance element. The same applies to all embodiments and examples described later.

Second Embodiment

In a magnetic impedance sensor according to the second embodiment, from the viewpoint of energy-savings of the sensor, the absolute value of the compensating pulse current is set to be smaller than the absolute value of the basic pulse current.

Figure 4:
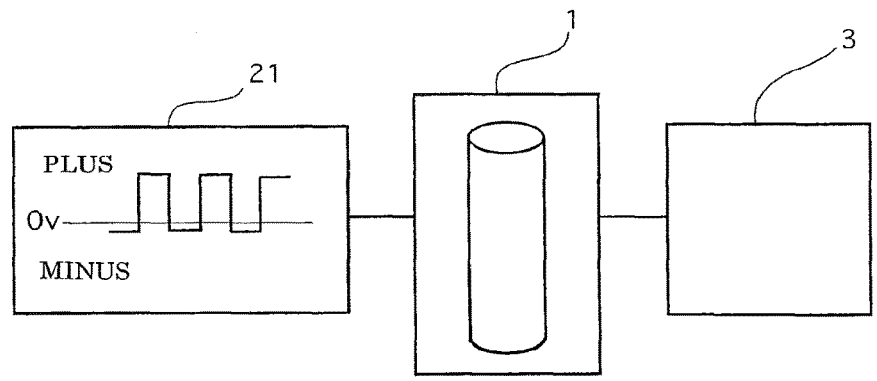
FIG. 4 is a block diagram showing an essential portion of a magnetic impedance sensor according to a second embodiment of the present invention, and a diagram showing a waveform of a pulse current to be supplied to the amorphous wire in the second embodiment.

That is, according to the second embodiment, the oscillator means 2 shown in FIG. 3 in the first embodiment is replaced by a pulse oscillator means 21 as shown in FIG. 4, and the pulse oscillator means 21 is constructed to alternately output a basic pulse current and a compensating pulse current with polarity opposite to the basic pulse current.

Accordingly, by alternately supplying positive and negative currents to the amorphous wire 1, the amorphous wire 1 is repeatedly reversely magnetized in the u and v circumferential directions so that a zero-magnetized state is passed through or passed over when performing magnetization in the circumferential direction by the basic pulse current, and accordingly, the linear characteristics are compensated, and therefore, a magnetic sensor with excellent linear characteristics is realized, and the amorphous wire 1 is supplied with current so that an absolute value of the compensating pulse current falls within a range of 0.1% or more and 100% or less of the absolute value of the basic pulse current, and a magnetic signal is output by the signal processing means 3.

FIG. 1 is a diagram that shows an example of characteristics of a magnetic impedance sensor using an amorphous wire as a magneto-sensitive material, where the horizontal axis represents the applied magnetic field µT (micro tesla) and the vertical axis represents the sensor output voltage v (volt), and shows the results of measurement by using an amorphous wire made of an FeCoSiB-based alloy with an outer diameter of 10 µm and a length of 6 mm. The relationship between the magnetic field and the sensor output voltage deviates from a linear relationship (true value), and an error (deviation) up to 3 to 4% occurs. That is, in this measurement, as is clear from FIG. 1, non-linear characteristics are shown in all regions of the applied magnetic fields, and a discontinuous variation is shown in the vicinity of 10 µT.

Figure 5:
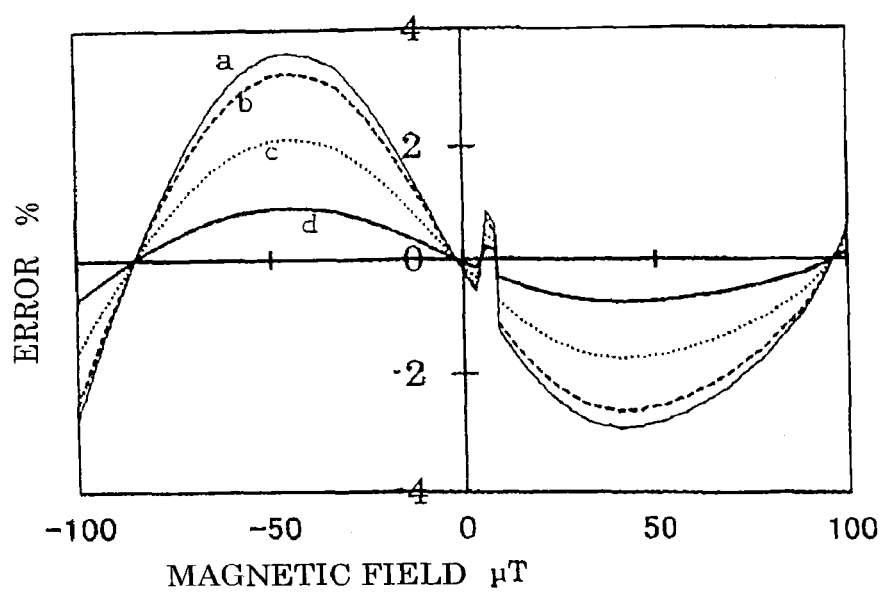
FIG. 5 is a diagram showing a relationship between a magnetic field applied to the magnetic impedance sensor according to the second embodiment and an error.

When these characteristics are expressed in terms of a magnitude of deviation from ideal characteristics, that is, error, they are represented by the error curve a in FIG. 5 in which the horizontal axis represents the applied magnetic field (µT) and the vertical axis represents the error (%).

That is, in FIG. 5, the error becomes maximum in the vicinity of −50 µT, and the value shows a discontinuous error as described above, approximately 3.6% and in the vicinity of 10 µT. A possible cause of these non-linear characteristics is an individual physical factor of the amorphous wire used as a magneto-sensitive material of the magnetic impedance sensor.

In the second embodiment, when the effect of supply with the compensating pulse current is set to be exerted when the maximum error decreases by approximately 10%, that is, when the error becomes approximately 3.3 or less, the magnitude of the compensating pulse necessary for this was approximately 0.1% of the basic pulse in this embodiment. The results in this case are shown by the error curb b in FIG. 5. At this time, the portion of the discontinuous error also showed attenuation at an equal ratio as compared with the error curve shown by a. The absolute value of the error at the discontinuous variation portion is smaller than the maximum error, and does not especially become a problem.

In the second embodiment, the reason for setting the effect to be exerted when the maximum error decreases by approximately 10% is described as follows.

Figure 6:
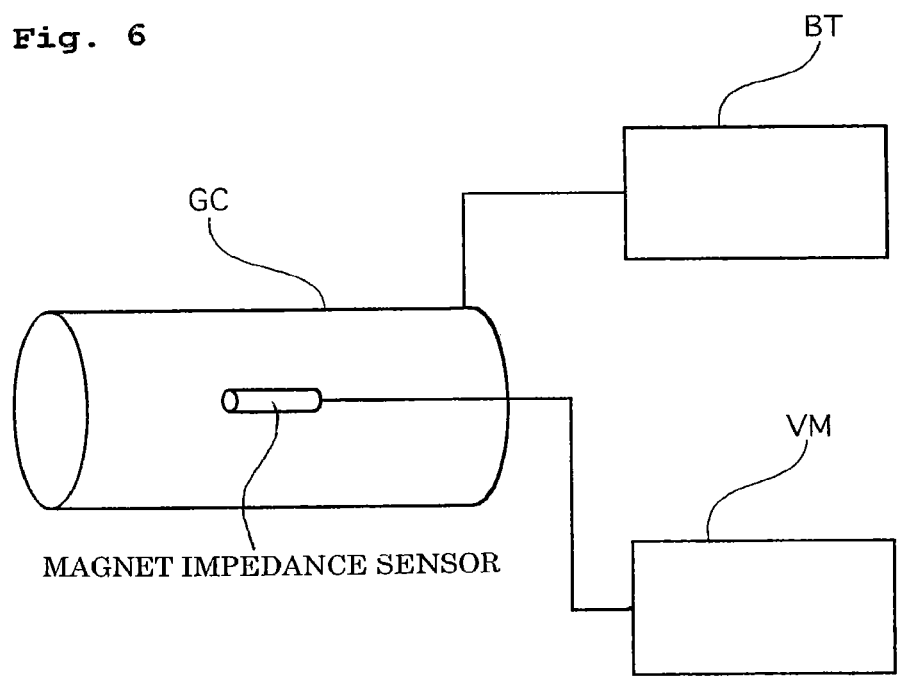
FIG. 6 is an explanatory view for describing a measurement system that measures characteristics of a magnetic impedance sensor.

The characteristics of the magnetic sensor are measured by using a magnetic sensor characteristic measurement system including a magnetic field applying solenoid coil GC for generating a magnetic field in which a magnetic impedance sensor to be measured is placed, a power source device BT for supplying a current to the coil, and a voltmeter VM for reading an output of the sensor as shown in FIG. 6, and all of allowable errors of these devices were 1% or less.

Therefore, when using the characteristic measurement system described above, the maximum error is estimated to be almost 3%, so that observation of a change three times or more as large as the maximum error, that is, a 10% change, was considered to be sufficiently significant.

In the second embodiment, the reason for setting the absolute value of the compensating pulse current smaller than the absolute value of the basic pulse current is that, for obtaining an effect of improving accuracy, it is unnecessary that the current values for the same absolute values are supplied, and the smaller current setting is effective since this reduces the power to be supplied to the amorphous wire 1 and enables energy-savings of the magnetic sensor.

The reason for setting the absolute value of the compensating pulse current so as to fall within the range of 0.1% or more and 100% or less of the absolute value of the basic pulse current is that the lower limit is a value that causes an effect of improving the linear characteristics to start appearing and the upper limit enables magnetic field measurement with both positive and negative voltage outputs with the same sensitivity, and a current value increased beyond the upper limit is disadvantageous in terms of energy-savings.

Thus, the magnetic impedance sensor according to the second embodiment exerts operations and effects of realizing excellent linear characteristics as a magnetic sensor, and by reducing the average current to be supplied to the amorphous wire, achieving energy-savings.

Third Embodiment

In a magnetic impedance sensor according to a third embodiment, in view of energy-savings of the sensor, a certain period of time without supplying a current is interposed between the basic pulse current and the compensating pulse current.

Figure 7:
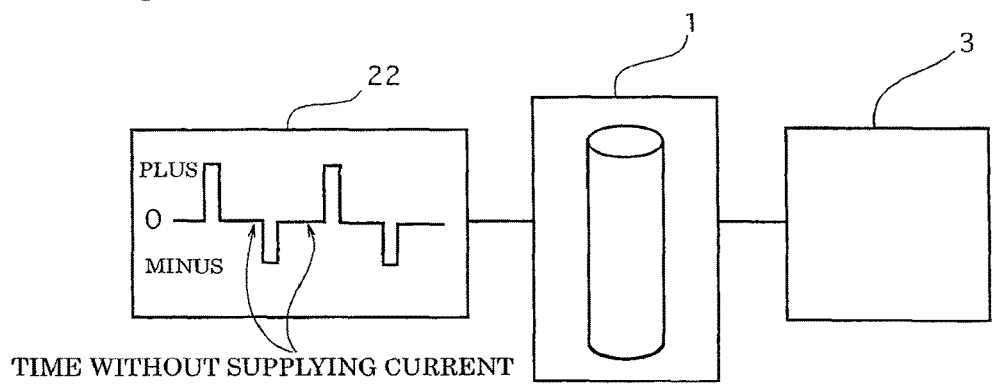
FIG. 7 is a block diagram showing an essential portion of a magnetic impedance sensor according to a third embodiment of the present invention, and a diagram showing a waveform of a pulse current to be supplied to an amorphous wire in the third embodiment.

That is, in the magnetic impedance sensor according to the third embodiment, the oscillator means 2 shown in FIG. 3 in the first embodiment is replaced by a pulse oscillator means 22 shown in FIG. 7, and the pulse oscillator means 22 repeatedly reversely magnetizes the amorphous wire 1 in the u and v circumferential directions by alternately outputting a positive pulse and a negative pulse, and therefore, by passing through or passing over a zero-magnetized state when performing circumferential magnetization by the basic pulse current, magnetic detection characteristics with excellent linearity are realized, and by interposing a certain period of time without supplying a current between the positive pulse and the negative pulse, the average current to be supplied to the amorphous wire 1 is reduced, and accordingly, further operations and effects of realizing a magnetic sensor with a high energy-saving effect are obtained.

Fourth Embodiment

Figure 8:
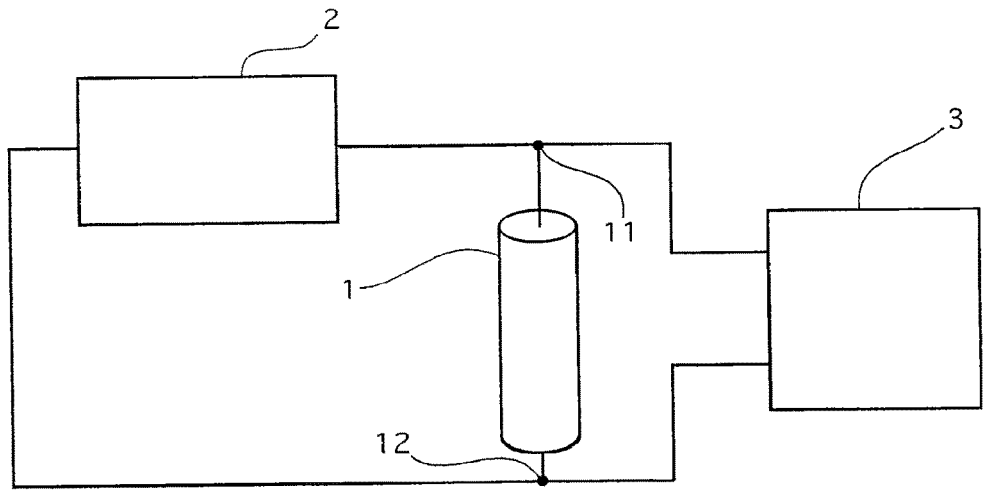
FIG. 8 is a block diagram showing an essential portion of a magnetic impedance sensor according to a fourth embodiment of the present invention.

A magnetic impedance sensor according to a fourth embodiment is simply constructed to directly detect an alternate current voltage at both ends of the amorphous wire 1 as shown in FIG. 8 in view of enabling cost reduction.

That is, the magnetic impedance sensor according to the fourth embodiment is constructed as shown in FIG. 8, in at least any one of the first to third embodiments, to detect a magnetic signal by the signal processing means 3 based on an alternate current voltage in response to an external magnetic field around the amorphous wire 1 generated between both ends of the amorphous wire 1, that is, between one electrode 11 and the other electrode 12 according to the magnetic impedance effect of the amorphous wire 1 by pulse current supply of the pulse oscillator means 2, and for the reasons described in the first embodiment to the third embodiment, exerts operations and effects of realizing an energy-saving magnetic sensor that enables output of a magnetic signal voltage with excellent linear characteristics.

Fifth Embodiment

Figure 9:
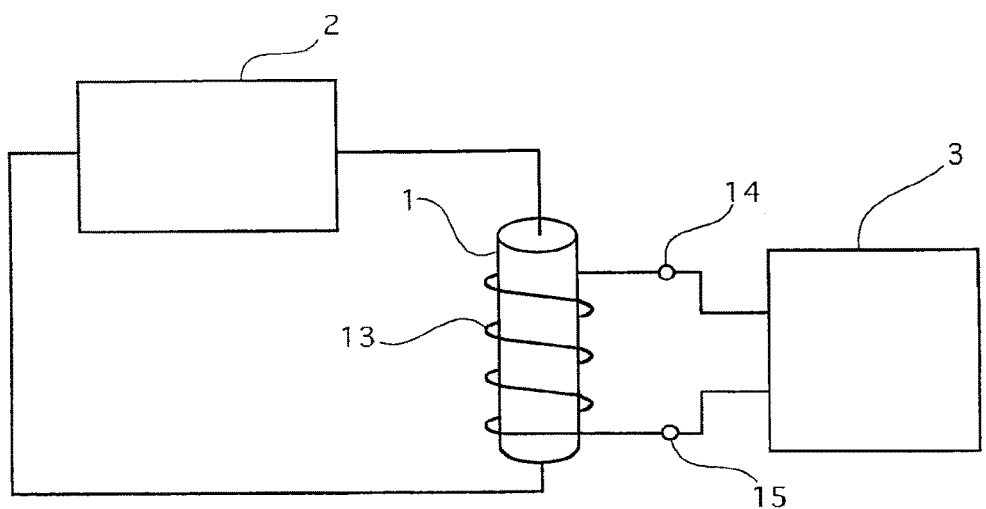
FIG. 9 is a block diagram showing an essential portion of a magnetic impedance sensor according to a fifth embodiment of the present invention.

A magnetic impedance sensor according to a fifth embodiment is constructed so that, as shown in FIG. 9, a detecting coil is wound around the amorphous wire 1, and magnetic detection is performed based on an alternate current voltage at both ends of the detecting coil.

The magnetic impedance sensor according to the fifth embodiment is constructed as shown in FIG. 9, in at least any one of the first to third embodiments, to detect a magnetic signal by the signal processing means 3 based on an alternate current voltage generated according to the magnetic impedance effect between two electrodes 14 and 15 of a detecting coil 13 wound around the amorphous wire 1 by pulse current supply of the pulse oscillator means 2, and for the reasons described in the first embodiment to the third embodiment, exerts operations and effects of realizing an energy-saving magnetic sensor that enables output of a magnetic signal voltage with excellent linear characteristics.

First Example

A magnetic impedance sensor according to a first example is based on the first embodiment to the fourth embodiment described above, and includes, as shown in FIG. 10, an amorphous wire 1 that outputs an alternate current voltage in response to a magnetic field intensity around the amorphous wire from both ends, a pulse oscillator means 22 that outputs a pulse current provided with a certain period of time without supplying a current interposed between a basic pulse current and a compensating pulse current to be supplied to the amorphous wire, and a signal processing means 3 that includes a rectifying circuit 31 and an amplifier OP to convert the pulse current into a signal in response to an amplitude of an alternate current voltage output from both ends of the amorphous wire 1, and outputs a magnetic signal voltage in response to a magnetic field intensity around the amorphous wire 1.

Figure 10:
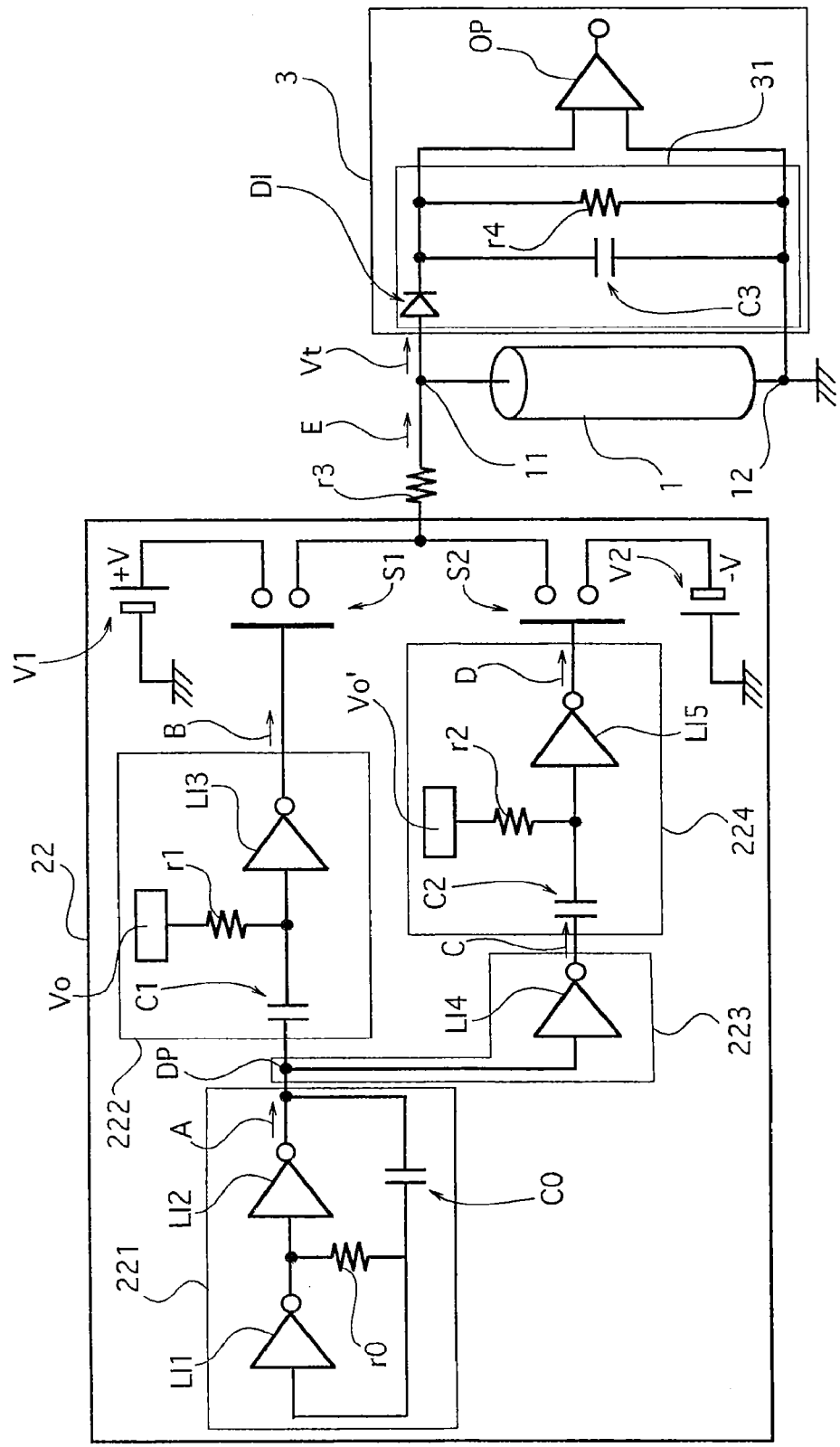
FIG. 10 is a detailed circuit diagram showing details of a magnetic impedance sensor of a first example of the present invention.
Figure 11:
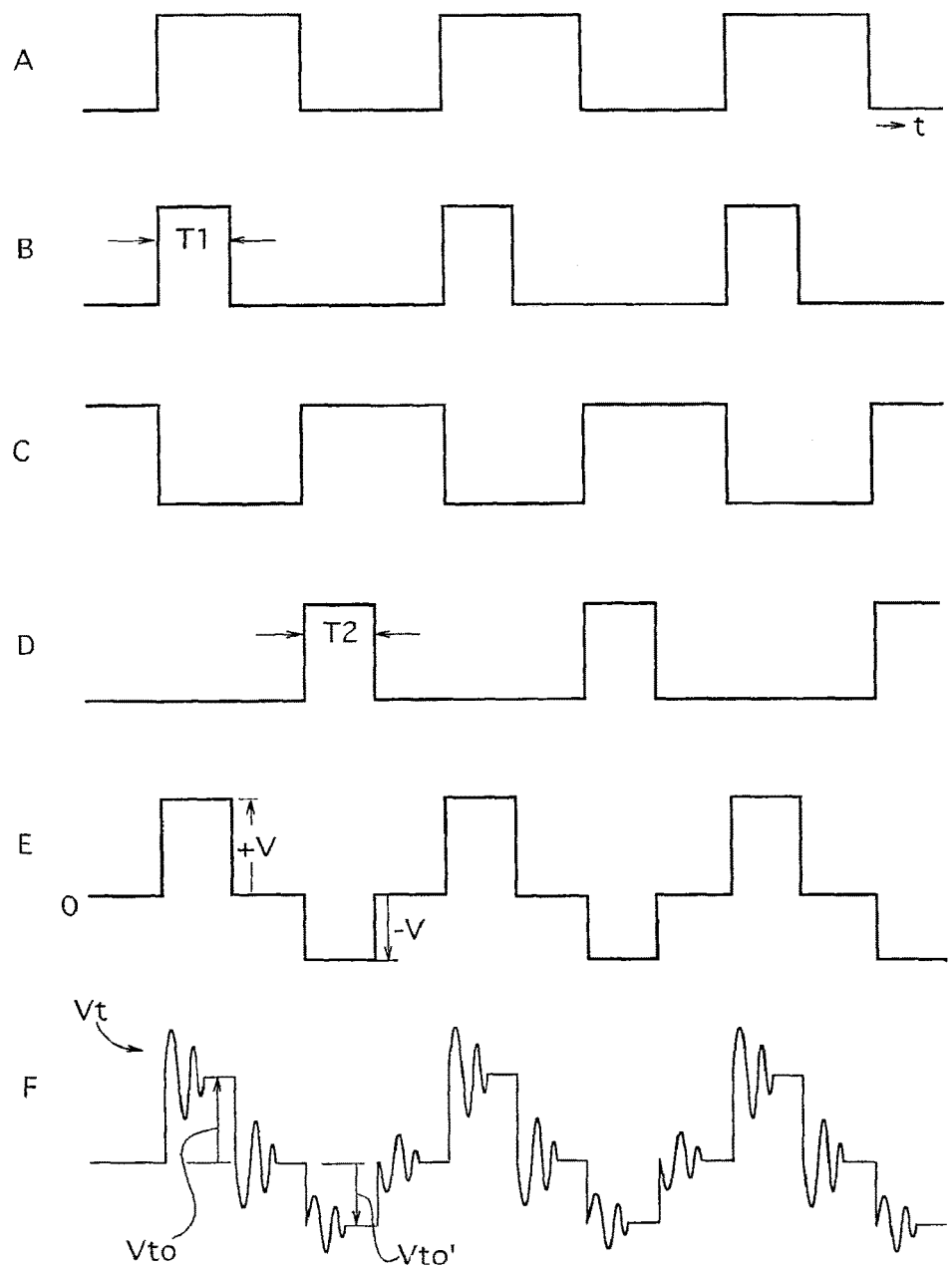
FIG. 11 is a diagram showing waveforms of pulse currents and output voltages of the amorphous wire in the first example.

The pulse oscillator means 22 shown in FIG. 10 includes a square-wave oscillation circuit 221 that outputs a square-wave output A shown in FIG. 11, a first differential pulse generating circuit 222 that is connected to an output terminal of the square-wave oscillation circuit 221 and outputs a pulse B with a predetermined pulse width, a phase inverter circuit 223 that is connected to the output terminal of the square-wave oscillation circuit 221 and outputs an inverted square-wave output C, a second differential pulse generating circuit 224 that is connected to an output terminal of the phase inverter circuit 223 and outputs a pulse D with a predetermined pulse width, and first and second electronic switches S1 and S2 that are respectively connected to the output terminals of the first and second differential pulse generating circuits 222 and 224 and output pulses of voltages +V and −V.

The square-wave oscillation circuit 221 includes, as shown in FIG. 10, first and second logic elements LI1 and LI2 connected in series, a resistor r0 whose both ends are connected to an input terminal and an output terminal of the first logic element LI1, and a capacitor C0 whose both ends connected to the input terminal of the first logic element LI1 and an output terminal of the second logic element LI2, and is constructed to output a square-wave output A with a predetermined pulse height and width shown in FIG. 11.

The first differential pulse generating circuit 222 includes a capacitor C1 whose one end is connected to the output terminal of the square-wave oscillation circuit 221, a logic element Ll3 whose input terminal is connected to the other end of the capacitor C1, and a resistor r1 connected to the other end of the capacitor C1 and the power source Vo, and is constructed to output a pulse B with a predetermined pulse width T1 shown in FIG. 11 shorter than the pulse width of the square-wave output A by applying differential processing to the square-wave output A.

The phase inverter circuit 223 includes a logic element Ll4 whose one end is connected to a diverging point DP connected to the output terminal of the square-wave oscillation circuit 221 and outputs a square-wave output C with an opposite phase shown in FIG. 11 by inverting the phase of the square-wave output A.

The second differential pulse generating circuit 224 includes a capacitor C2 whose one end is connected to the output terminal of the phase inverter circuit 223, a logic element Ll5 whose input terminal is connected to the other end of the capacitor C2, and a resistor r2 connected to the other end of the capacitor C2 and the power source Vo', and is constructed to output a pulse D with a predetermined pulse width T2 shown in FIG. 11 shorter than the pulse width of the square-wave output A by applying differential processing to the square-wave output C with the opposite phase by the resistor r2 and the capacitor C2.

The first electronic switch S1 is constructed so as to be ON/OFF controlled based on a high level and a zero level of a pulse B from the first differential pulse generating circuit 222, and by controlling connection between the first power source V1 that outputs a predetermined positive voltage +V and the pulse output terminal, output a pulse E of the voltage +V as a positive basic pulse current shown in FIG. 11.

The second electronic switch S2 is constructed so as to be ON/OFF controlled based on a high level and a zero level of a pulse D from the second differential pulse generating circuit 224, and by controlling connection between the second power source V2 that outputs a predetermined negative voltage −V and the pulse output terminal, output a pulse E of the voltage −V as a negative compensating pulse current shown in FIG. 11. The absolute values of the voltages +V and −V to be respectively output from the first power source V1 and the second power source V2 can be arbitrarily set in consideration of linearity, power consumption, and heat characteristics, etc., and may be set to be equal to each other or different from each other, and FIG. 11 shows a case where the absolute value of the voltage −V is smaller than the absolute value of the voltage +V by way of example.

The pulse oscillator means 22 has the detailed construction described above, and an output terminal thereof is connected to an electrode 11 on one end of the amorphous wire 1 through the resistor r3 having an output terminal set to a predetermined impedance, and outputs a predetermined pulse current in which a certain period of time without supplying a current is interposed between a supply time of the positive basic pulse current and a supply time of the compensating pulse current as shown in FIG. 11, and the absolute value of the negative compensating pulse current is 0.1% or more and 100% or less of the positive basic pulse current.

The amorphous wire 1 is a magneto-impedance element made of a magneto-sensitive material of an FeCoSiB-based alloy with high sensitivity enabling detection of a magnetic field intensity at a level of several nT (nT: $1/10^9$ of tesla) or less.

The signal processing means 3 includes a rectifying circuit 31 having two input terminals respectively connected to both electrodes 11 and 12 of the amorphous wire 1, and including a diode DI that is connected to the one electrode 11 whose one end is connected to the one end of the amorphous wire 1 and allows only positive signals to pass through, a capacitor C3 connected to the other end of the diode DI and the other electrode 12 connected to the other end of the amorphous wire 1, and a resistor r4 connected in parallel to the capacitor C3.

The signal processing means 3 includes an amplifier OP that has two input terminals connected to two output terminals of the rectifying circuit 31 and amplifies a rectified voltage input at a predetermined amplification degree.

In the magnetic impedance sensor of the first example constructed as described above, in the pulse oscillator means 22, the square-wave oscillation circuit 221 outputs the square-wave output A shown in FIG. 11, and the first differential pulse generating circuit 222 outputs the pulse B shown in FIG. 11 with a pulse width T1 determined according to the resistor r1 and the capacitor C1.

The phase inverter circuit 223 outputs a square-wave output C shown in FIG. 11 with an opposite phase obtained by inverting the square-wave output A output from the square-wave oscillation circuit 221 through the diverging point DP.

The second differential pulse generating circuit 224 outputs a pulse D shown in FIG. 11 with a pulse width T2 determined according to the resistor r2 and the capacitor C2 by applying differential processing to the inverted square-wave output C.

In a period during which the input differential pulse B shown in FIG. 11 is "1" in terms of logic level, the first electronic switch S1 is turned "ON" and accordingly outputs the voltage +V as a pulse output E shown in FIG. 11. In a period during which the input differential pulse D shown in FIG. 11 is "1" in terms of logic level, the second electronic switch S2 is turned "ON" and accordingly outputs the voltage −V as a pulse output E shown in FIG. 11.

That is, by differential processing in the first and second differential pulse generating circuits 222 and 224, a predetermined pulse current, (E in FIG. 11) (E in FIG. 11 shows the voltage as well as the current) in which a predetermined period of time without supplying a current is interposed between a positive basic pulse current and a negative compensating pulse current as shown in E in FIG. 11, and the absolute value of the negative compensating pulse current is 0.1% or more and 100% or less of the absolute value of the positive basic pulse current, is supplied to the amorphous wire 1 through the resistor r3.

When the pulse current E (shown in FIG. 11) is applied to the amorphous wire 1 from the pulse oscillator means 22, due to the magnetic impedance effect of the amorphous wire 1, an external magnetic field intensity around the amorphous wire 1 appears as a magnitude of the amplitude of the alternate current signal Vt (F in FIG. 11) (F in FIG. 11 shows voltage as well as current) superposed on the pulse current F shown in FIG. 11 between two electrodes 11 and 12 at both ends of the amorphous wire 1. The base potentials Vto and Vto' of the alternate current signal Vt are voltages appearing at both ends of the amorphous wire 1 according to the applied positive or negative pulse current E.

The magnitude of the amplitude of the alternate current signal Vt is in response to an intensity of an external magnetic field in which the amorphous wire 1 is placed, and the alternate current signal Vt is rectified so as to be in response to the amplitude of the alternate current signal and converted into a voltage signal in the rectifying circuit 31 including the diode DI, the resistor r4, and the capacitor C3, amplified by the amplifier OP connected to the rectifying circuit 31, and accordingly output as a magnetic signal voltage.

In the magnetic impedance sensor according to the first example, the amorphous wire 1 is repeatedly reversely magnetized in the u and v circumferential directions by being alternately supplying the positive and negative pulse currents to the amorphous wire 1, so that by passing through or passing over a zero-magnetized state when performing magnetization in the circumferential direction by the basic pulse current, an upper limit magnetized state where a positive current of the voltage pulse E shown in FIG. 11 acts and a lower limit magnetized state where a negative current of the voltage pulse E acts are alternately reversed, and in a case where, between these states, the pulse current is held in a zero state to reduce the consumption current, for example, in a case where after the negative compensating pulse current is applied to the amorphous wire 1 and the negative lower limit magnetized state is entered, the pulse current becomes zero and the magnetizing force becomes zero, due to the hysteresis, the state does not completely return to the zero-magnetized state and the negative magnetized state partially remains, however, subsequently, when the positive basic pulse current is applied thereto, the zero-magnetized state positioned between the upper limit magnetized state and the lower limit magnetized state is passed over, and then a positive upper limit magnetized state is entered. Therefore, when performing magnetic detection at the rise time or the like of the pulse current, no harmful influences remain, and then, when the applied pulse current becomes zero, due to hysteresis, the state does not completely return to the zero-magnetized state and the positive magnetized state partially remains, however, subsequently, when the negative compensating pulse current is applied thereto, after the zero-magnetized state is passed over, the negative lower limit magnetized state is entered on the magnetized state therein corresponding to the logic level of "0" in the conventional technology. Thus, by compensating linear characteristics, excellent linear characteristics are obtained, and in addition, by providing a predetermined period of time without supplying a current, operations and effects of realizing an energy-saving magnetic sensor and improving heat characteristics are obtained.

In the first example, a period during which the voltage pulse E does not flow is provided, and a period during which the magnetized state is zero is provided, however, after the positive current is applied across the zero-magnetized state, a negative current is applied in reverse, so that the period during which the pulse current is held at zero is interposed between the upper limit magnetized state and the lower limit magnetized state in the variation range of the magnetized state, and after the magnetization is reversed to the positive or negative magnetized state, the pulse current is held in the zero state, and even if magnetization slightly remains due to the hysteresis thereof, when magnetization is performed by the next pulse current, the zero-magnetized state is always passed over, and therefore, when magnetic detection is performed at the rise time or the like of the pulse current, no harmful influences on linearity remain, and excellent linearity is secured.

Hereinafter, the results of measurement with the magnetic impedance sensor of the first example are described.

A maximum error when the absolute value of the compensating pulse current was increased to 1% of the basic pulse current decreased by 40% and the magnitude of the error decreased to approximately 2.1% as shown by the error curve c in FIG. 5.

When the absolute value of the compensating pulse current was increased to 10% of the pulse current, the maximum error decreased by approximately 75% and the magnitude of the error reached 0.93% as shown by the error curve d in FIG. 5. The degree of this effect is just one example, and will change on actuality in response to characteristics that vary depending on the amorphous wire having the specifications such as length and diameter, etc., and heat treatment.

Second Example

A magnetic impedance sensor according to a second example is based on the first embodiment, the third embodiment, and the fifth embodiment described above, and includes, as shown in FIG. 12, a detecting coil 13 that is wound around the amorphous wire 1 and outputs an alternate current voltage in response to an external magnetic field intensity around the amorphous wire 1 from both ends, a pulse oscillator means 23 that supplies a pulse current in which a certain period of time without supplying a current is interposed between a positive basic pulse current and a negative compensating pulse current to be supplied to the amorphous wire 1, and outputs an opening and closing pulse to control opening and closing of a switch element SW of a signal processing means 3 described later, and the signal processing means 3 including a sample-hold circuit 32 that holds a voltage in response to an amplitude of an alternate current voltage output from the detecting coil 13 and an amplifier OP that amplifies the held voltage.

Figure 12:
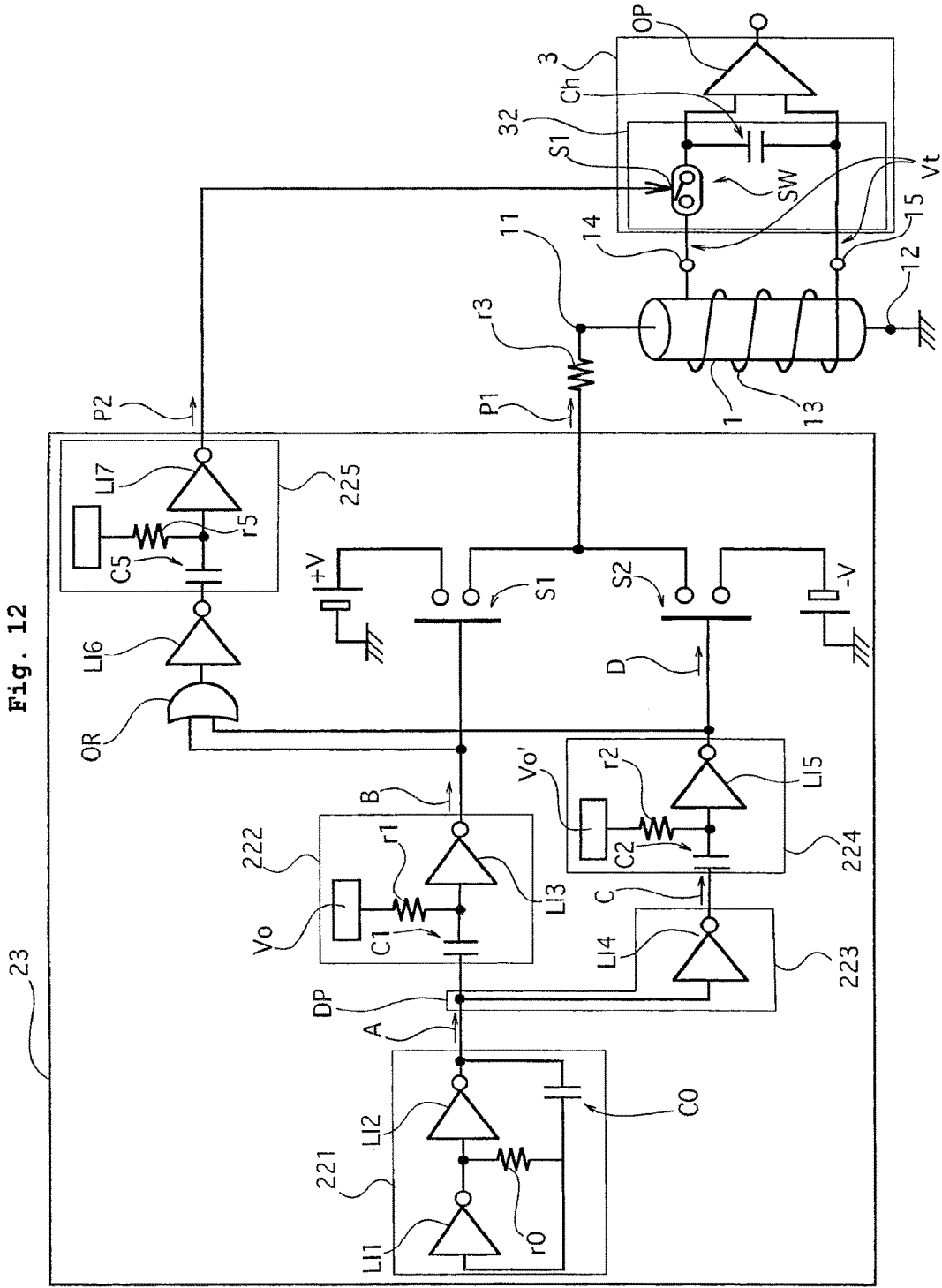
FIG. 12 is a detailed circuit diagram showing details of a magnetic impedance sensor of a second example of the present invention.

The pulse oscillator means 23 shown in FIG. 12 includes a square-wave oscillation circuit 221 that outputs a square-wave output A as shown in FIG. 13, a first differential pulse generating circuit 222 that is connected to an output terminal of the square-wave oscillation circuit 221 and outputs a pulse B with a predetermined pulse width, a phase inverter circuit 223 that is connected to the output terminal of the square-wave oscillation circuit 221 and outputs a square-wave output C, a second differential pulse generating circuit 224 that is connected to an output terminal of the phase inverter circuit 223 and outputs a pulse D with a predetermined pulse width, first and second electronic switches S1 and S2 that are respectively connected to output terminals of the first and second differential pulse generating circuits 222 and 224 and output voltages +V and −V, an OR circuit OR connected to the first and second differential pulse generating circuits 222 and 224, a logic element LI6 connected to the OR circuit OR, and a third differential circuit 225 connected to the logic element LI6, and is constructed by adding the OR circuit OR and a third differential circuit 225 to the pulse oscillator means 22 shown in FIG. 10. Therefore, descriptions of common circuit portions are omitted, and the OR circuit OR, the logic circuit LI6, and the third differential circuit 225 provided only in the pulse oscillator means 23 are described below.

The absolute values of the voltages +V and −V to be output from the first power source V1 and the second power source V2 can be arbitrarily set in consideration of linearity, consumption current, and heat characteristics, etc., and may be set to be equal to each other or different from each other, and although FIG. 11 showing the preceding example shows a case where the absolute value of the voltage −V is smaller than the absolute value of the voltage +V, in the present example, as shown in FIG. 13, a case where the absolute value of the voltage −V and the absolute value of the voltage +V are equal to each other is described by way of example.

The OR circuit OR is constructed so as to have two input terminals respectively connected to the output terminals of the first and second differential pulse generating circuits 222 and 224, and output a time-series summed pulse P0 shown in FIG. 13 obtained by time-series summing the input differential pulses B and D shown in FIG. 11. The logic element LI6 has an input terminal connected to the output terminal of the OR circuit.

The third differential pulse generating circuit 225 includes a capacitor C5 whose one end is connected to an output terminal of the logic element LI6, a logic element LI7 connected to the other end of the capacitor C5, and a resistor r5 connected to the other end of the capacitor C5 and the power source V0, and is constructed to output a pulse P2 with a predetermined pulse width T3 for opening and closing an analog switch SW described later by applying differential processing to the summed pulse P0 in time series shown in FIG. 13 by the resistor r5 and the capacitor C5.

The pulse oscillator means 23 constructed as described above is connected to an electrode 11 on one end of the amorphous wire 1 through the resistor r3 set to a predetermined impedance, and is constructed to output a pulse current P1 to be supplied to the amorphous wire in which a certain period of time without supplying a current is interposed between a positive basic pulse current and a negative compensating pulse current as shown in FIG. 13(c) and an opening and closing pulse P2 with a positive predetermined width to an opening and closing control terminal S1 of the switch element as shown in FIG. 13(b).

The amorphous wire 1 is made of a high-sensitivity magnetic impedance element of magneto-sensitive material made of an FeCoSiB-based alloy as in the first example described above as shown in FIG. 12, and is constructed so that both ends are connected to the pulse oscillator means 23 through the electrode 11 and the electrode 12, and by an MI effect induced by supply of the pulse current P1 shown in FIG. 13, as an alternate current voltage signal with an amplitude in response to an external magnetic field around the amorphous wire 1, an alternate current signal Vt that is the detection output shown in FIG. 13(d) is output from the electrodes 14 and 15 on both ends of the detecting coil 13 wound around the amorphous wire 1.

As shown in FIG. 12, the signal processing means 3 has both input terminals connected to both electrodes 14 and 15 connected to both ends of the detecting coil 13, and includes a sample-hold circuit 32 that includes an analog switch SW comprising a switch element having an input terminal connected to the electrode 14 connected to the one end of the detecting coil 13 and an opening and closing control terminal S1 connected to an output terminal from which the opening and closing pulse P2 is output of the pulse oscillator 23, and a hold capacitor Ch whose one end is connected to an output terminal of the analog switch SW and the other end is connected to the electrode 15 connected to the other end of the detecting coil 13, and sample-holds an alternate current signal accompanying positive and negative pulse currents at predetermined timings.

The signal processing means 3 includes an amplifier OP that amplifies a voltage signal sample-held by the hold capacitor Ch to a predetermined value and outputs the sample-held voltage signal as a magnetic signal voltage in response to an external magnetic field around the amorphous wire 1.

In the magnetic impedance sensor according to the second example constructed as described above, in the pulse oscillator means 23 shown in FIG. 12, the square-wave oscillation circuit 221 outputs the square-wave output A shown in FIG. 11, and the first differential pulse generating circuit 222 outputs the pulse B shown in FIG. 11 with a pulse width that is shorter than the pulse width of the square-wave output A determined according to the resistor r1 and the capacitor C1.

The phase inverter circuit 223 outputs the square-wave output C shown in FIG. 11 with an opposite phase obtained by inverting the square-wave output A output from the square-wave oscillation circuit 221. The second differential pulse generating circuit 224 outputs the pulse D shown in FIG. 11 with a pulse width that is shorter than the pulse width of the inverted square-wave output C determined according to the resistor r2 and the capacitor C2 by applying differential processing to the inverted square-wave output C.

In a period during which the differential pulse B shown in FIG. 11 is "1" in terms of logic level, the first electronic switch S1 is turned "ON" and accordingly outputs the pulse as a pulse output P1 of the voltage +V shown in FIG. 13. In a period during which the differential pulse D shown in FIG. 11 is "1" in terms of logic level, the electronic switch S2 is turned "ON" and accordingly outputs the pulse as a pulse output P1 of the voltage −V shown in FIG. 13.

In time series, the OR circuit OR sums the differential pulses B and D shown in FIG. 11 output from the first and second differential pulse generating circuits 222 and 224. The third differential pulse generating circuit 225 outputs the pulse P2 shown in FIG. 13 which is for opening and closing the analog switch SW and has a predetermined pulse width shorter than the pulse widths of the pulses B and D by applying differential processing to the summed pulse P0 in time series shown in FIG. 13 input through the logic element L16 by the resistor r5 and the capacitor C5.

Therefore, the pulse oscillator means 23 applies a positive and negative pulse current P1 (shown in FIG. 13(c)) in which a predetermined period of time without supplying a current is interposed between a positive pulse and a negative pulse and the absolute values of the voltages are substantially equal to each other to the amorphous wire 1 through the current regulating resistor r3, and always applies a positive opening and closing pulse P2 (shown in FIG. 13(b)) with a predetermined short duration to the opening and closing control terminal S1 of the analog switch SW described later in synchronization with the pulse current P1.

The amorphous wire 1 brings about or attains a magnetic impedance effect by applying the pulse current P1 to the amorphous wire 1 by means of the pulse oscillator means 23, and accordingly, the alternate current signal Vt shown in FIG. 13(d) in response to an external magnetic field in which the amorphous wire 1 is placed, appears between the two electrodes 14 and 15 of the detecting coil 13 wound around the amorphous wire 1.

In the second example, as described above, since the positive and negative pulses are applied so that the absolute values of the voltages are equal to each other by way of example, in the alternate current signal Vt, the positive pulse and the negative pulse have substantially the same waveform and the same amplitude, and therefore, in the second example, both of the alternate current signals Vt when a positive pulse is applied and when a negative pulse is applied are sample-held at a predetermined positive timing according to the opening and closing pulse P2 applied to the opening and closing control terminal S1 of the analog switch SW by the sample-hold circuit 32 including the analog switch SW and the hold capacitor Ch.

The voltage sample-held by the hold capacitor Ch is amplified to a predetermined value by the amplifier OP and output as a magnetic signal voltage in response to an external magnetic field around the amorphous wire 1.

The magnetic impedance sensor according to the second example exerting the effects described above sample-holds and outputs both of alternate current voltages Vt when a positive pulse current is applied and when a negative pulse current is applied, so that an effect of further improving linear characteristics is exerted by averaging slight differences in characteristics of the magnetic impedance effect between magnetizations in the u and v circumferential directions of the amorphous wire 1.

In addition, in the magnetic impedance sensor according to the second example, by repeatedly reversely magnetizing the amorphous wire 1 in the u and v directions according to application of positive and negative pulse currents of the pulse current P1 to the amorphous wire 1, a zero-magnetized state is passed through or passed over when magnetization in the circumferential direction is performed by the basic pulse current, and accordingly, an upper limit magnetized state where a positive current of the pulse current P1 shown in FIG. 13 acts and a lower limit magnetized state where a negative current of the pulse current P1 acts are alternately reversed, and between these states, for reducing the consumption current, the pulse current is reduced to zero to keep the enforced force to magnetize in a zero state, however, as in the first example, in the case where magnetic detection is performed at the rise time or the like of the pulse current after passing over the zero-magnetized state according to the pulse current, no harmful influences on linearity remain, and in combination with obtained excellent linear characteristics, an effect of realizing further improvement in accuracy of the magnetic sensor is exerted.

Further, in the magnetic impedance sensor according to the second example, a predetermined period of time without supplying a current is interposed between the positive pulse and the negative pulse, so that by reducing an average consumption current, an energy-saving effect is also obtained, and heat characteristics of the sensor are also improved.

In the second example, a period of time without supplying a pulse current is also provided, however, for the same reason as in the first example described above, no harmful influences on linearity remain, and excellent linearity can be secured.

Figure 14A:
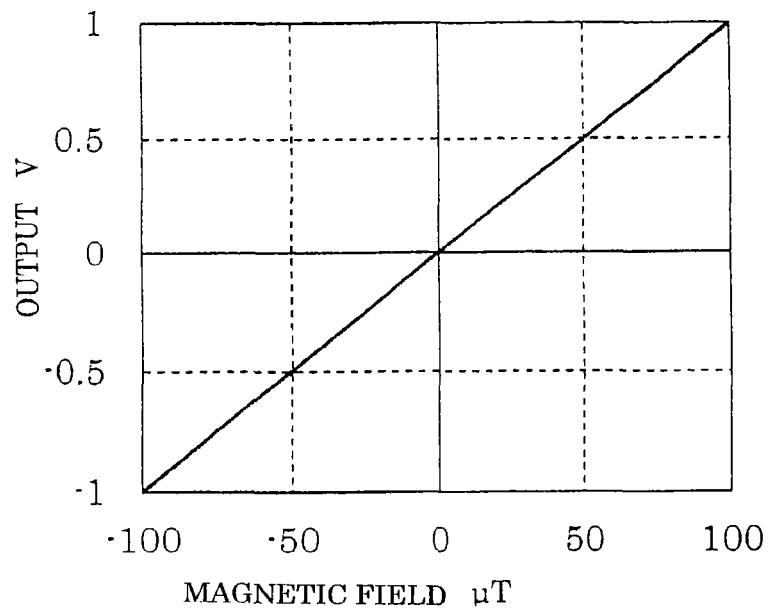
FIG. 14(a) and FIG. 14(b) are diagrams showing linearity and errors in the magnetic impedance sensor of the second example.
Figure 14B:
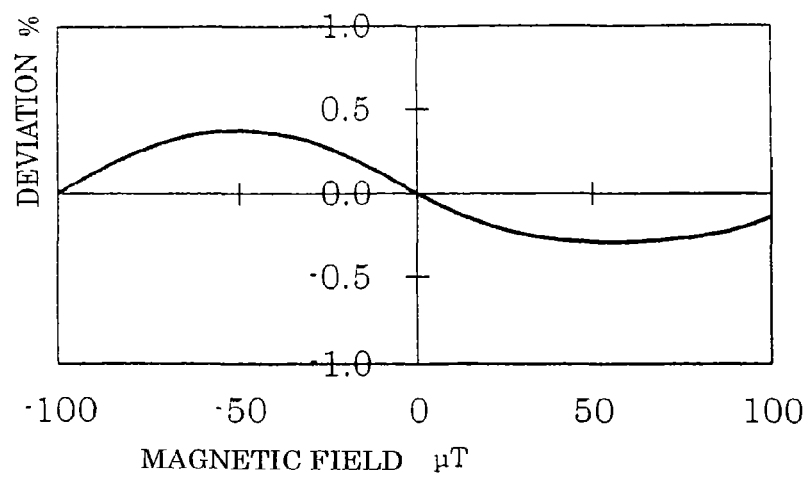

The results of measurement of linear characteristics in the second example are shown in FIG. 14(a) and FIG. 14(b).

FIG. 14(a) shows the relationship between the magnetic field and the sensor output measured by using a measuring device shown in FIG. 6 when the magnetic impedance sensor was disposed inside a coil that generated a uniform magnetic field and magnetic fields of −100 to +100 IT were applied, where the horizontal axis represents the magnetic field (μT) and the vertical axis represents the output (V), and clearly shows linearity more excellent than in FIG. 1 described above.

In FIG. 14(b), to clearly show improvement from non-linearity, the horizontal axis represents the magnetic field (μT) and the vertical axis represents the deviation (error amount) in percent figures from the true value, and as is clear from this figure, the deviation is approximately 0.5% at maximum, and a great effect of reducing the deviation to ⅕ or less of that in the case shown as "a" in FIG. 5 was obtained.

The preferred embodiments and examples of the present invention, as herein disclosed are taken as some embodiments for explaining the present invention. It is to be understood that the present invention should not be restricted by these embodiments and any modifications and additions are possible so far as they are not beyond the technical idea or principle based on description of the scope if the patent claims.

In all of the above-described embodiments and examples, a case where an amorphous wire is used as the magneto-impedance element is described, however, the same effects can also be obtained even when a thin film is used as the magneto-sensitive element.

In the above-described examples, the case where the positive basic pulse current and the negative compensating pulse current are used is described by way of example, however, the present invention is not limited to this, and a modification using a negative basic pulse current and a positive compensating pulse current can also be adopted as necessary.

In the above-described examples, a case where a certain period of time without supplying a current is interposed between a basic pulse current and a compensating pulse current is described by way of example, however, the present invention is not limited to this, and a modification can also be adopted in which the first and second differential pulse generating circuit 222 and 224 in the pulse generator means 22 and 23 shown in FIG. 10 and FIG. 12 are removed, and by directly connecting the square-wave oscillation circuit 221 and the phase inverter circuit 223 to the first and second electronic switches S1 and S2, a pulse current in which a period of time without supplying a current is not interposed between the basic pulse current and the compensating pulse current is applied to the amorphous wire, and as compared with the first and second examples described above, the circuit is simplified and the costs can be reduced, and by passing through or instantly passing over a zero-magnetized state when the amorphous wire is magnetized in the circumferential direction by the basic pulse current, no period in which the amorphous wire is kept in a zero-magnetized state is interposed, so that this modification has an advantage that excellent linear characteristics are obtained.

In the modification, an effect of improving linear characteristics is obtained by setting the absolute value of the compensating pulse current to 0.1% or more of the absolute value of the basic pulse current, so that by adjusting the absolute value of the compensating pulse current to a relatively low value within a range in which the target improvement effect is obtained, the average consumption current and heat characteristics can be restrained.

Figure 15A:
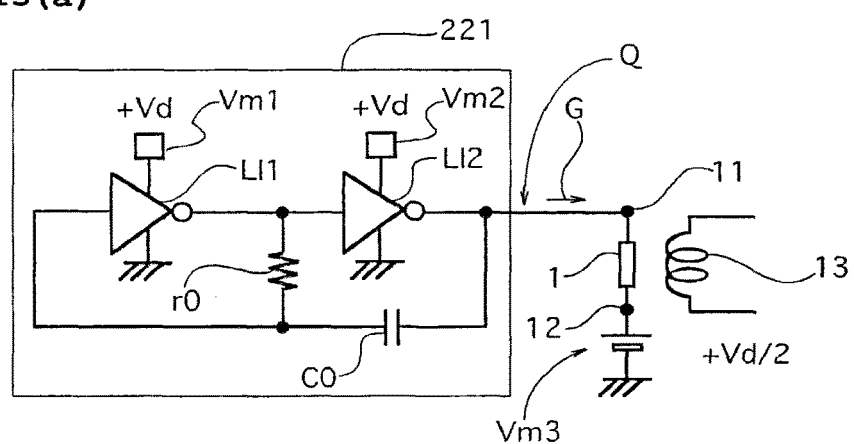
FIG. 15(a) and FIG. 15(b) are a detailed circuit diagram showing details of a pulse oscillator means and a diagram showing a waveform of a pulse current to be supplied to the amorphous wire and a detection output in a modification of the present invention.
Figure 15B:
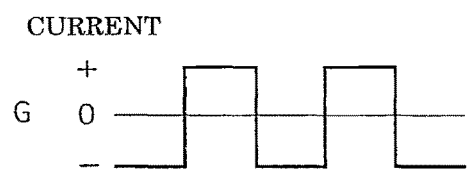
Figure 16:
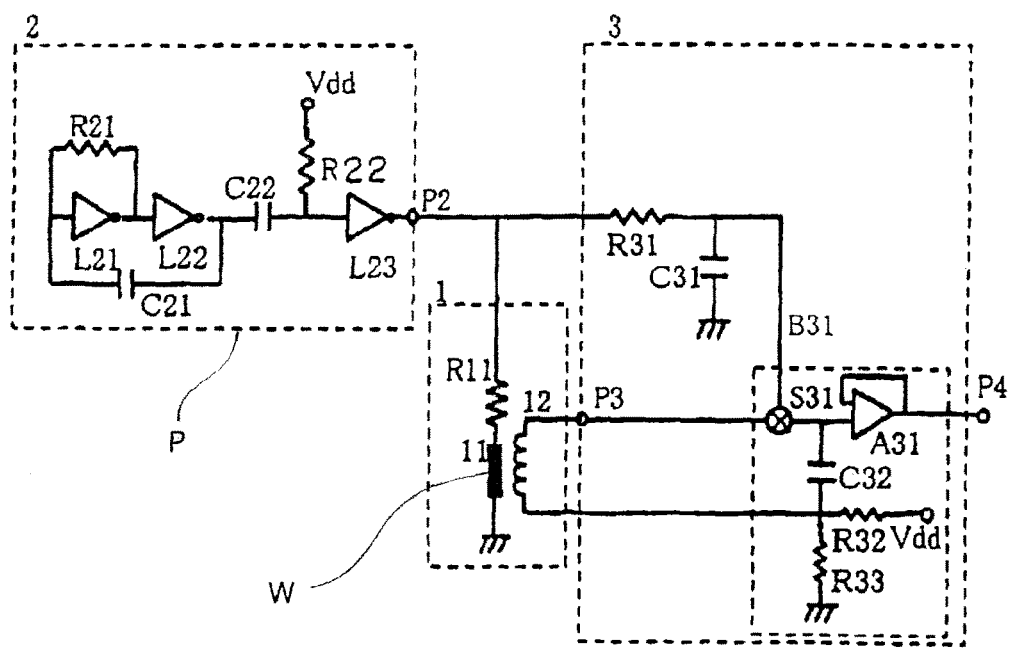
FIG. 16 is a detailed circuit diagram showing details of a conventional magnetic impedance sensor.

In the above-described modification, a case where the period of time without supplying a current is not interposed between the basic pulse current and the compensating pulse current is described by way of example, however, the present invention is not limited to this, and a modification can also be adopted in which, as shown in FIG. 15(a), both power source voltages of the power sources Vm1 and Vm2 of the first and second logic elements LI1 and LI2 connected in series in the above-described square-wave generating circuit 221 are set to +Vd, and the power source Vm3 set to a power source voltage of +Vd/2 is connected to one end 12 of the amorphous wire 1, and when the voltage at the output terminal Q of the square-wave generating circuit 221 is "+Vd," a current flows from the point Q toward the power source Vm3 set to +Vd/2 through the amorphous wire 1, and when the voltage at the output terminal Q is "0", a current flows from the power source Vm3 set to Vd/2 toward the output terminal Q through the amorphous wire 1, so that the pulse current G shown in FIG. 15(b) is applied to the amorphous wire 1, and therefore, this modification has advantages that the circuit is further simplified and the costs can be reduced as compared with the aforementioned modification, and bypassing through or instantaneously passing over a zero-magnetized state when the amorphous wire is magnetized in the circumferential direction by the basic pulse current, no period during which the amorphous wire is kept in a zero-magnetized state is interposed, and accordingly, excellent linear characteristics are obtained.

INDUSTRIAL APPLICABILITY

The present invention is preferable for use in high-accuracy magnetic detection in the field of physics and chemistry, measurement of geomagnetic or other microscopic fluctuations caused by volcanism or the like, and long-time continuous magnetic measurement, etc.

What is claimed is:

1. A magnetic impedance sensor comprising:
   a pulse oscillator configured to apply an electrical pulse current to a magneto-impedance element;
   the magneto-impedance element configured to generate an alternate current voltage corresponding to a magnetic field intensity around the magneto-impedance element; and
   signal processing circuitry configured to signal process the alternate current voltage corresponding to the magnetic field intensity around the magneto-impedance element generated by the magneto-impedance element and output the signal processed alternate current voltage, wherein
   an alternate current voltage corresponding to the external magnetic field intensity around the magneto-impedance element is generated by applying the electrical pulse current to the magneto-impedance element,
   the magneto-impedance element is configured to measure the external magnetic field intensity around said magneto-impedance element as the generated alternate current voltage,
   the electrical pulse current comprises a basic pulse current for generating the alternate current voltage corresponding to the external magnetic field around the magneto-impedance element and a compensating pulse current having opposite polarity to the basic pulse current, the compensating pulse current being for compensating for linear characteristic of the magnetic impedance sensor to linearly change output voltage in response to a change of the external magnetic field intensity,
   the pulse oscillator is configured to apply the basic pulse current and the compensating pulse current alternately to the magneto-impedance element, and a magnetization of the magneto-impedance element in a circumferential direction is alternately reversed between positive and negative magnetized states across a zero-magnetized state where the magnetization of the magneto-impedance element in the circumferential direction is zero by shifting the magnetization of the magneto-impedance element to an opposite polarity direction always after passing or going through the zero-magnetized state in order to avoid the zero-magnetized state of the magneto-impedance element in the circumferential direction, and
   an absolute value of the compensating pulse current is set by the pulse oscillator to be within a range, the range being a rate of 0.1%-10% smaller than an absolute value of the basic pulse current.

2. The magnetic impedance sensor according to claim 1, wherein
   a period of time without supplying the current is interposed between a time for supplying the basic pulse current of applying to said magneto-impedance element and a time for supplying the compensating pulse current thereof.

3. The magnetic impedance sensor according to claim 1, wherein
   the signal processing circuitry is configured to output a magnetic signal voltage by detecting a magnetic signal based on the alternate current voltage generated on both ends of said magneto-impedance element.

4. The magnetic impedance sensor according to claim 2, wherein
   the signal processing circuitry is configured to output a magnetic signal voltage by detecting a magnetic signal based on the alternate current voltage generated on both ends of said magneto-impedance element.

5. The magnetic impedance sensor according to claim 2, wherein
   the signal processing circuitry is configured to output a magnetic signal voltage by detecting a magnetic signal based on the alternate current voltage generated on both ends of said magneto-impedance element.

6. The magnetic impedance sensor according to claim 1, wherein
   the signal processing circuitry is configured to output a magnetic signal voltage by detecting a magnetic signal based on the alternate current voltage generated on both ends of a detecting coil wound around said magneto-impedance element.

7. The magnetic impedance sensor according to claim 2, wherein
   the signal processing circuitry is configured to output a magnetic signal voltage by detecting a magnetic signal based on the alternate current voltage generated on both ends of a detecting coil wound around said magneto-impedance element.

8. The magnetic impedance sensor according to claim 2, wherein
   the signal processing circuitry is configured to output a magnetic signal voltage by detecting a magnetic signal based on the alternate current voltage generated on both ends of a detecting coil wound around said magneto-impedance element.

* * * * *